United States Patent [19]

Pausch et al.

[11] Patent Number: 4,931,136
[45] Date of Patent: Jun. 5, 1990

[54] METHOD AND APPARATUS FOR MANUFACTURING A METAL CONTACT WITH OVERHANGING EDGES

[75] Inventors: Thomas Pausch, Freising; Josef Willer, Riemerling, both of Fed. Rep. of Germany

[73] Assignee: Siemens Aktiengesellschaft, Berlin and Munich, Fed. Rep. of Germany

[21] Appl. No.: 390,642

[22] Filed: Aug. 7, 1989

[30] Foreign Application Priority Data

Aug. 5, 1988 [DE] Fed. Rep. of Germany ....... 3826733

[51] Int. Cl.$^5$ .................... B44C 1/22; C23F 1/02; C03C 15/00; C03C 25/06
[52] U.S. Cl. .................... 156/643; 156/646; 156/656; 156/659.1; 156/345; 204/192.35; 204/298.31
[58] Field of Search ............ 156/643, 646, 656, 659.1, 156/345; 204/192.32, 192.35, 298 E, 298 EP; 427/38, 39; 437/228, 245, 246

[56] References Cited

U.S. PATENT DOCUMENTS

| 4,253,907 | 3/1981 | Parry et al. | 156/643 |
| 4,307,283 | 12/1981 | Zajac | 156/643 X |
| 4,384,938 | 5/1983 | Desilets et al. | 156/643 X |
| 4,578,559 | 3/1986 | Hijikata et al. | 204/298 E |

OTHER PUBLICATIONS

Article entitled "Important Considerations in Selecting Anisotropic Plasma Etching Equipment" by S. Broydo, from Solid State Technology, Apr. 1983.
Article entitled "Reactive-Ion Etching" by Gottlieb S. Dehrlein, from Physics Today, Oct. 1986.
Article entitled "Electrode Separation and Convex Electrode Surfaces in Plasma Etching" from Journal of Vac.Sc. Tech., by K. Eisele, Jul./Aug. 1987.
Article entitled "New Trends and Limits in Plasma Etching" from J. Phys. D.: Appl. Phys. 20 (1987), by Peccoud et al.

Primary Examiner—William A. Powell
Attorney, Agent, or Firm—Hill, Van Santen, Steadman & Simpson

[57] ABSTRACT

This invention relates to a method and apparatus for manufacturing a metal contact with overhanging upper edges. The metal contact has at least one specific layer tapering away from the surface of a semiconductor layer structure. The metal contact is formed by RIE and mask technology, in which a concavely formed equipotential boundary surface is formed between an anode and a cathode. In a preferred embodiment, the curvature is achieved by selecting the effective areas of the cathode and anode so that their rate is no greater than 3:4.

8 Claims, 2 Drawing Sheets

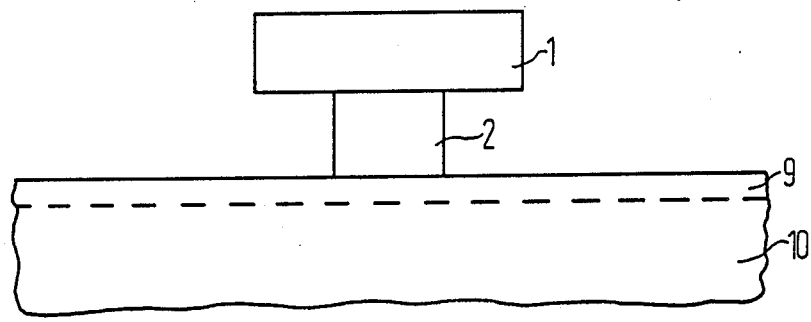
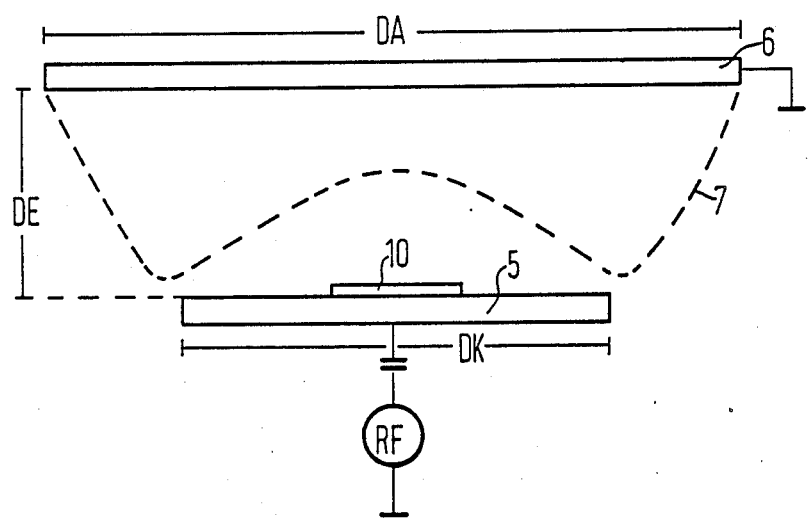

METHOD AND APPARATUS FOR MANUFACTURING A METAL CONTACT WITH OVERHANGING EDGES

BACKGROUND OF THE INVENTION

The miniaturization of components has become a major focal point of semiconductor technology in recent decades because of the possibility of achieving integration densities as well as high switching speeds. Increasing difficulties in light-optical photo techniques are encountered when the size of such components falls below 1μm. Self-aligning processes wherein the gate metallization, for example in MESFED, acts as mask with reference to subsequent process steps (for example n+—implantations and/or source/drain contacts) have been employed with some success.

In such self-aligning processes, further tempering steps are usually executed after the application of the gate metallization, requiring that the metallization be adequately stable with respect to such tempering processes. In order to achieve this stability along with electrically effective gate lengths below 1 μm, low lead resistances over adequately large gate cross-sections must be realized. To this end, the metal contacts are fashioned with overhanging edges.

Gate metallizations having a T-shaped structure have been produced using a dry etching process. At least two layers composed of different metals are required for the production of such overhanging metallizatons. Photoresist or a third metal structure deposited in a lift-off technique can serve as etching mask. The selection of the metals in such a process is critical because of the selective etching that is required. The first metal layer deposited must be attached more strongly during etching than the second metal layer situated thereabove. The resultant gate metallizations have a first metal layer and a second metal layer that form a step-shaped discontinuous cross-section. Such a structure is commonly produced in that, first, an etching mask is applied and the two metal layers are then etched down on a straight line to the semiconductor surface with an anisotropic etching. High anisotropy is attained in the etching in that the pressure of the plasma is kept low during the dry etching process and the cathode voltage is set high. After the two metal layers have been etched out they are of the same diameter and extend perpendicular to the surface of the semiconductor layer structure. Next, a considerably intensified etching attack is performed on the second metal layer. This is achieved, for example, by changing the gas composition and/or by increasing the process pressure. As a rule, this is carried out with a surface-preserving, isotropic etching process that sequences with a low power density. The size of the underetching is thereby determined via the etching time. There is no end point signal as can be detected, for example, when etching through from a defined layer to a different layer (e.g., where detection is via modification of the optical properties of the plasma). This limits the precision and reproducibility of the underetching in practice. The cross-section of the metal contact structure thus acquires a "T-shape"

When etching is performed using an RIE system, what is referred to as "positive column", in which the potential is constant, forms in front of the anode. This positive column extends toward the surface of the cathode. A dark field zone is situated at the surface of the cathode, this dark field zone being separated from the positive column by an equipotential surface that proceeds nearly parallel to the surface of the cathode and of the substrate.

SUMMARY OF THE INVENTION

This invention relates to a method and apparatus for manufacturing a metal contact with overhanging upper edges. The metal contact is situated on a semiconductor layer structure on a substrate, and has at least one specific metal layer of uniform composition tapering toward the surface of the semiconductor layer structure. The overhanging of the upper edges of the metal contact is effected by the taper o the specific metal layer. The metal contact is formed by reactive ion etching (RIE) and mask technology, in which the substrate is applied on a cathode which is spaced from an anode. RIE is performed in such a way that an equipotential surface forms a boundary between a positive column and a dark field zone. This equipotential surface is concavely curved with respect to the substrate.

In a preferred embodiment, the curvature of this boundary is achieved by selecting the dimensions that determine the effective sizes of the cathode and the anode so that their ratio is no greater than 3:4. These dimensions may be diameters. It is an object of the invention to provide a method and apparatus for the precise and reproducible manufacture of metal contacts with overhanging edges.

It is another object of the invention to provide a method for manufacturing metal contacts with overhang edges wherein, during RIE, the process pressure amounts to at most 10μbar, and the power density amounts to at least 0.05 w/cm$^2$.

This invention also contemplates the provision of means for performing RIE so that an equipotential surface is formed above a substrate. This equipotential surface is concavely curved with respect to the substrate.

Other objects and advantages of the present invention will be apparent upon reference to the accompanying description when taken in conjunction with the following drawings:

BRIEF DESCRIPTION OF THE DRAWINGS

FIG. 1 shows a metal contact with overhanging edges of the prior art.

FIG. 2 shows the critical components of a RIE apparatus.

DESCRIPTION OF THE PREFERRED EMBODIMENTS

Figure 3:
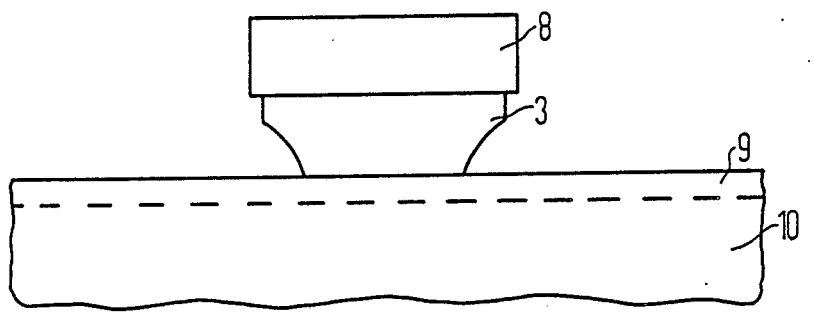
FIG. 3 shows a metal contact of the invention having an etching mask situated thereon.
Figure 4:
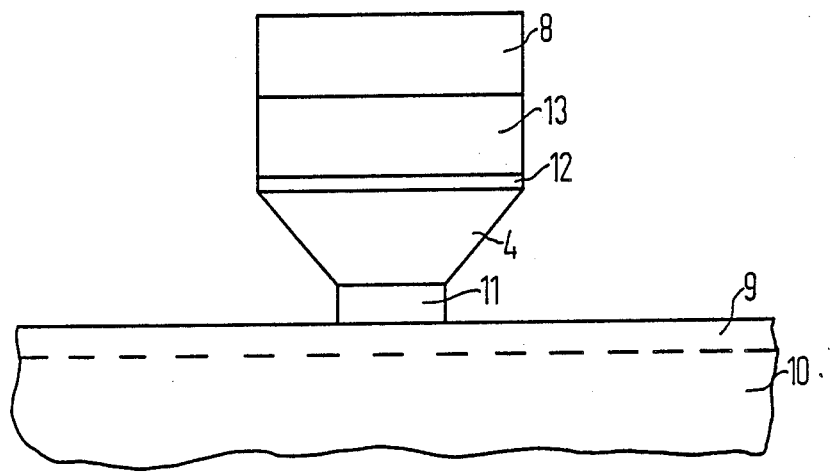
FIG. 4 shows a multilayer metal contact of the invention with an etching mask situated thereon.

Instead of producing the overhanging edges of the metal contact as in the prior art (FIG. 1) wherein a second metal layer 2 is applied and a first metal layer 1 that overhangs beyond this second metal layer 2 is applied, the metal contact produced by means of the present invention comprises a specific metal layer 3 (FIG. 3) that is integrally constructed. It is composed of, for example, only one metal, and it tapers toward the substrate 10. FIG. 3 shows the substrate 10 with the semiconductor layer structure 9 situated thereon. The specific metal layer 3 forming the metal contact, and having an etching mask 8 used in its manufacture is situated on the substrate. This specific metal layer 3 is fashioned so that it projects beyond the actual contact between metal and semiconductor material. The overhanging, upper edges of the metal contact are formed without requiring two different metal layers. The present invention can be used in forming specific metal layers that are composed of only a single metal, as well as in forming specific metal layers that are composed of different elements, for example alloys. What is critical is that this specific metal layer has a uniform composition in the sense that no metal layers delimited from one another are present. As shown in FIG. 4, this does not exclude the fact that a specific metal layer 4 of the invention is not applied directly on the semiconductor layer structure 9 for the formation of overhanging edges; rather, the metal-to-semiconductor contact is formed by a first, further metal layer 11 on which the said, specified metal layer 4 is applied and further metal layers—a second, further metal layer 12 and a third, further metal layer 13—follow the specific layer 4.

The specific metal layer (3, 4) of the invention that comprises metal edges projecting beyond the contact surface steadily tapers toward the substrate. This is distinct from the prior art gate metallization having a discontinuous transition between the metal layers 1, 2 shown in FIG. 1. Various degrees of taper and cross-sectional shapes are attainable with the present invention. In FIG. 3, the specific metal layer 3 comprises upper edges perpendicular to the surface of the semiconductor structure 9, and a lower section that tapers arcuately toward the substrate 10. The specific metal layer 4 shown in FIG. 4, by contrast, comprises a cross-section having linear limitations. Other cross-sections are also attainable with the present invention. For example, a surface of the metal layer could be format facing and parallel to the substrate, or parts of the tapering region could have a progressive decrease in diameter.

Since the present invention eliminates the isotropic underetching step, the imprecision of the line width control inherent in this step (given the lack of an end point signal) is also eliminated. Instead, the line width is determined via the taper, an etching step whose end point can be exactly detected. This significantly increases etching precision.

The following is a description of a preferred embodiment of the method and apparatus for the manufacture of a metal contact comprising the present invention. In accordance with the present invention, the positive column situated in front of the anode 6 (see FIG. 2) in the RIE process does not define an equipotential surface that proceeds parallel to the cathode 5 and essentially parallel to the substrate 10 applied thereon. Rather, this equipotential surface 7 is concavely arced with respect to the cathode 5. The dark field zone over the substrate 10 then has a significantly larger expanse than is otherwise standard. This curvature of the boundary 7 of the positive column is achieved in that the ratio of cathode diameter DK to anode diameter DA is selected to be no greater than 3:4. If the electrodes are non-circular, whatever dimensions determine the effective areas of the electrodes should be selected in the above ratio. Based on experimental findings, the course of the boundary 7 of the positive column required for the method of the invention derives for an electrode spacing DE that is greater than about 4 cm and given process pressures below 10 $\mu$bar and power densities greater than 0.5 watts/cm$^2$. The metal that has been applied for the formation of the specific metal layer 3, 4 can, for example, be WSi$_x$, and the etching gas can be SF$_6$.

In a further embodiment of the invention, the metal to be etched can be composed of a plurality of layers, for example WSi$_x$, W, TiN and Au. The structure recited in FIG. 4 is obtained by selective etching of the various metal layers, whereby the specific metal layer 4 is composed of tungsten, the first, further metal layer 11 is composed of WSi$_x$, the second, further metal layer 12 is composed of TiN and the third, further metal layer 13 is composed of gold. This layer structure has a low electrical resistance, a bondable gold cover layer and a TiN layer as diffusion barrier. The structure of the specific metal layer 4 enables gate metallizations in the submicrometer which may be useful, for example, in the course of self-aligning processes in a field effect transistor.

Although this invention has been illustrated and described in connection with specific embodiments, it will be apparent to those skilled in the art that various changes may be made therein without departing from the scope and spirit of the invention as set forth in the appended claims.

We claim:

1. In a method for the manufacture of a metal contact having overhanging upper edges, said metal contact being situated on a semiconductor layer structure on a substrate, wherein said metal contact comprises at least one specific metal layer of uniform composition tapering toward the surface of the semiconductor layer structure, wherein the overhanging of the upper edges of said metal contact is effected by the taper of the specific metal layer, the improvement comprising:
   forming said metal contact by reactive ion etching (RIE) and mask technology in which said substrate is applied on a cathode and;
   effecting RIE such that an equipotential surface forms a boundary between a positive column and a dark field zone, said equipotential surface being concavely curved with respect to said substrate.

2. The improvement of claim 1, wherein RIE is effected under a process pressure that amounts to at most 10 $\mu$bar, and a power density amounts to at least 0.5 W/cm$^2$.

3. An apparatus for effecting reactive ion etching in the manufacture of a metal contact situated on a semiconductor layer structure on a substrate, said apparatus comprising:
   a cathode having a surface for the acceptance of said substrate;
   an anode spaced from said cathode and connected to a voltage supply;
   wherein the spacing between the cathode and the anode is at least 4 cm, and;
   wherein the ratio of the dimension that defines the size of the effective area of the cathode to that of the anode is at most 3:4.

4. The apparatus of claim 3, wherein the effective areas of cathode (5) and anode (6) are circular and the dimensions defining their sizes are their diameters.

5. In a method for performing reactive ion etching, the steps comprising:
   providing a cathode and an anode each having a dimension defining the size of its effective area; and
   selecting said dimensions such that the ratio of the cathode dimension to the anode dimension is at most 3:4.

6. The method of claim 5, further wherein said dimensions are diameters.

7. An apparatus for manufacturing metal contacts situated on a substrate, said apparatus comprising:
   means for performing reactive ion etching, and;
   means for forming an equipotential surface facing said substrate during said reactive ion etching such that said equipotential surface is concavely curved with respect to said substrate.

8. The apparatus of claim 7, further wherein said means for forming an equipotential surface comprises:
   a cathode having a dimension defining its effective area;
   an anode having a dimension defining its effective area;
   wherein the ratio of said cathode dimension to said anode dimension is no greater than 3:4.

* * * * *